United States Patent
Miao

(10) Patent No.: US 10,931,435 B2
(45) Date of Patent: Feb. 23, 2021

(54) INTEGRATED PROCESSOR AND CDR CIRCUIT

(71) Applicant: FINISAR CORPORATION, Sunnyvale, CA (US)

(72) Inventor: Jason Y. Miao, Sunnyvale, CA (US)

(73) Assignee: II-VI DELAWARE, INC., Wilmington, DE (US)

( * ) Notice: Subject to any disclaimer, the term of this patent is extended or adjusted under 35 U.S.C. 154(b) by 0 days.

(21) Appl. No.: 16/293,412

(22) Filed: Mar. 5, 2019

(65) Prior Publication Data

US 2019/0199507 A1 Jun. 27, 2019

Related U.S. Application Data

(60) Division of application No. 14/552,314, filed on Nov. 24, 2014, now Pat. No. 10,225,071, which is a continuation of application No. 13/464,286, filed on May 4, 2012, now Pat. No. 8,896,357.

(51) Int. Cl.
| | |
|---|---|
| *H04L 7/00* | (2006.01) |
| *H04L 5/14* | (2006.01) |
| *H03L 7/087* | (2006.01) |
| *H04L 7/033* | (2006.01) |
| *H03L 7/191* | (2006.01) |
| *H04L 25/03* | (2006.01) |

(52) U.S. Cl.
CPC ............ *H04L 7/0079* (2013.01); *H03L 7/087* (2013.01); *H03L 7/191* (2013.01); *H04L 5/1438* (2013.01); *H04L 7/033* (2013.01); *H04L 25/03057* (2013.01)

(58) Field of Classification Search
CPC ....... H03L 7/099; H03L 7/091; H03L 7/0891; H03L 7/18; H03L 2207/06; H03L 7/097; H03L 7/104; H03L 7/191; H03L 7/148
USPC ............................................ 375/376; 327/48
See application file for complete search history.

(56) References Cited

U.S. PATENT DOCUMENTS

| | | | |
|---|---|---|---|
| 2009/0092213 A1* | 4/2009 | Eker | H04L 7/033 375/362 |
| 2010/0091925 A1* | 4/2010 | Nedovic | H03L 7/0891 375/359 |
| 2010/0246657 A1 | 9/2010 | Ou | |
| 2016/0234007 A1* | 8/2016 | Lee | H03L 7/23 |

* cited by examiner

*Primary Examiner* — David C Payne
*Assistant Examiner* — Sarah Hassan
(74) *Attorney, Agent, or Firm* — Blank Rome LLP

(57) ABSTRACT

A system may include a clock and data recovery circuit that includes one or more analog components. The system may also include processing circuitry configured to control the clock and data recovery circuit. The processing circuitry and the clock and data recovery circuit may be formed on a single substrate.

20 Claims, 4 Drawing Sheets

INTEGRATED PROCESSOR AND CDR CIRCUIT

CROSS-REFERENCE TO RELATED APPLICATIONS

This application is a divisional of U.S. patent application Ser. No. 14/552,314, filed Nov. 24, 2014, tilted INTEGRATED PROCESSOR AND CDR CIRCUIT, which is a continuation of U.S. patent application Ser. No. 13/464,286, filed May 4, 2012, titled INTEGRATED PROCESSOR AND CDR CIRCUIT, both which are incorporated herein by reference in their entirety.

BACKGROUND

Clock and data recovery (CDR) circuits may be implemented to allow a system to generate a clock signal, based on a received data signal that is synchronized with the received data signal. CDR circuits may be implemented using analog or digital components. In some circumstances, a CDR circuit may be implemented using multiple different components formed on separate substrates that are coupled using a printed circuit board. In other circumstances, a CDR circuit may be implemented using circuitry formed on a single substrate.

A CDR circuit may also have an associated state machine that may indicate to the CDR circuit basic states of functionality. Some of the basic states of functionality may include, whether a data signal is being received and/or if the CDR circuit is locked onto a received data signal. Typically, the associated state machine provides a rigid structure that does not allow the CDR circuit to adapt to changing circumstances. Additionally, the state machine may be formed separately from the CDR circuit and coupled to the CDR circuit using a printed circuit board.

The subject matter claimed herein is not limited to embodiments that solve any disadvantages or that operate only in environments such as those described above. Rather, this background is only provided to illustrate one exemplary technology area where some embodiments described herein may be practiced

SUMMARY

Some example embodiments generally relate to a system with a clock and data recovery circuit and a digital control circuit.

In an embodiment, a system, includes a clock and data recovery circuit and processing circuitry configured to control the clock and data recovery circuit based on previously stored data that includes a data rate of a previously received data signal from the clock and data recovery circuit. The processing circuitry controls the clock and data recovery circuit by directing the clock and data recovery circuit to begin at the data rate of the previously received data signal when locking to a data signal. The processing circuitry and the clock and data recovery circuit may be formed on a single substrate.

In an embodiment, the clock and data recovery circuit may include one or more analog components. The analog components may include a bipolar junction transistor. The processing circuitry may be implemented as a; digital control circuit in the form of a processor that includes a complementary metal-oxide semiconductor transistor.

In an embodiment, a system may include multiple clock and data recovery circuits that each includes one or more analog components. The system may also include a digital control circuit, such as a processor, configured to control the clock and data recovery circuits. The digital control circuit and the clock and data recovery circuits may be formed on a single substrate.

This Summary is provided to introduce a selection of concepts in a simplified form that are further described below in the Detailed Description. This Summary is not intended to identify key features or essential characteristics of the claimed subject matter, nor is it intended to be used as an aid in determining the scope of the claimed subject matter.

Additional features and advantages of the invention will be set forth in the description that follows or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

A more particular description of the invention will be rendered by reference to embodiments thereof, which are illustrated in the appended drawings. It is appreciated that these drawings depict only some embodiments of the invention and are therefore not to be considered limiting of its scope. The invention will be described and explained with additional specificity and detail through the use of the accompanying drawings in which.

DETAILED DESCRIPTION

Figure 1:
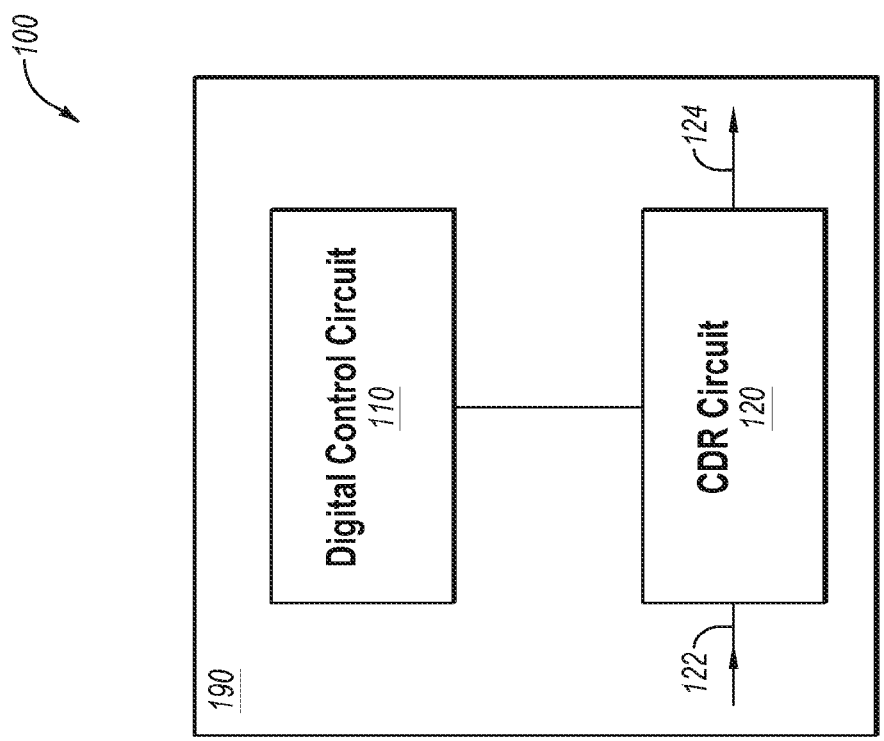
FIG. 1 is a block diagram of an example system with a clock and data recovery circuit.

FIG. 1 is a block diagram of an example system 100 with a clock and data recovery (CDR) circuit 120, arranged in accordance with at least some embodiments described herein. The CDR circuit 120 may receive a data signal on a data input lead 122 from an outside source and may be configured to generate and output a clock signal on a clock output lead 124 based on the data signal. The clock signal may be synchronized with the received data signal and may be used for clocking the data signal and/or otherwise coordinating the receipt and analysis of the data signal at components outside the system 100.

The data signal received on the data input lead 122 may be received from anyone of multiple types of data sources and may vary with time and/or may have any one of varying data rates. For example, in some embodiments, the data signal may be an electrical data signal generated from an optical signal. In these and other embodiments, the data signal may have a data rate of 0.5 GHz, 1 GHz, 2 GHz, 5 GHz, 10 GHz, 20 GHz, 40 GHz, or some other data rate. The CDR circuit 120 may be configured to adjust the frequency of the clock signal based on the varying data rate of the data signal so that the frequency of the clock signal matches the data rate of the data signal.

In some embodiments, the CDR circuit 120 obtaining the data rate of the data signal may be referred to as the CDR circuit 120 obtaining a lock on the data signal. In these and other embodiments, the CDR circuit 120 may have varying or set locking dynamics. Locking dynamics may indicate how the CDR circuit 120 obtains a lock on the data rate of the data signal.

The CDR circuit 120 may be coupled to a digital control circuit 110. The digital control circuit 110 may be configured to receive data from the CDR circuit 120. In some embodiments, the data from the CDR circuit 120 may include one or more of: voltage levels of the CDR circuit 120, power consumption of the CDR circuit 120, data rate of data signals received by the CDR circuit 120, a temperature of the CDR circuit 120, and transmit and receive power levels of the CDR circuit 120.

The digital control circuit 110 may also be configured to control and/or adaptively control the CDR circuit 120. In some embodiments, the digital control circuit 110 may control and/or adaptively control the CDR circuit 120 based on the data received from the CDR circuit 120. For example, in some embodiments, the digital control circuit 110 may be configured to determine a performance of the CDR circuit 120 based on the data received from the CDR circuit 120 and may adjust settings within the CDR circuit 120 to reduce power consumption of the CDR circuit 120 while maintaining the performance of the CDR circuit 120 above a threshold level.

As another example, the digital control circuit 110 may be configured to adaptively control the CDR circuit 120 based on a relationship between the signal integrity of a data signal on the data input lead 122 and the power consumption of the CDR circuit 120. In these and other embodiments, the digital control circuit 110 may adjust one or more voltage levels of one or more components of the CDR circuit 120 depending on the level of signal integrity of the data signal. The signal integrity of the data signal may include one or more of: an amount of time when the data signal may be sampled with fidelity, an amount of data signal variation, sensitivity of the data signal to timing errors, an amount of jitter in the data signal, or other aspects of the data signal. By adjusting the voltage levels of the one or more components of the CDR circuit 120, the digital control circuit 110 may adaptively control the power consumption of the CDR circuit 120.

An example of adaptively controlling the CDR circuit 120 based on a relationship between the signal integrity of the data signal on the data input lead 122 and the power consumption of the CDR circuit 120 follows. The CDR circuit 120 may properly perform when the signal integrity of the data signal is at and/or above a threshold level. When the signal integrity of the data signal is above the threshold level, the digital control circuit 110 may lower voltages levels of one or more components within the CDR circuit 120 to reduce the signal integrity of the data signal so that the signal integrity of the data signal is closer to but still above the threshold level. By reducing the voltage level, the power consumption of the CDR circuit 120 may be reduced.

As another example, the digital control circuit 110 may be configured to adaptively control the CDR circuit 120 by varying the locking dynamics of the CDR circuit 120. For example, in some embodiments, the CDR circuit 120 may send the data rate of a data signal on the data input lead 122 to the digital control circuit 110 after the CDR circuit 120 has locked to the data signal. The digital control circuit 110 may be configured to cause the data rate to be stored. When the CDR circuit 120 receives the data signal after losing a lock on the data signal, for example after the CDR circuit 120 is powered down or after a period when no data signal is being received on the data input lead 122, the digital control circuit 110 may direct the CDR circuit 120 to begin the process of locking to the data signal using the stored data rate.

As discussed, the digital control circuit 110 may be configured to adaptively control the CDR circuit 120 in varying ways. The digital control circuit 110 having adaptive control of the CDR circuit 120 may allow the system 100 to be optimized for one or more of: power consumption, faster locking rates, changes in data rates of a data signal on the data input lead 122, the amount of jitter or other signal integrity qualities of a data signal on the data input lead 122, among potentially other optimizable parameters.

As illustrated in FIG. 1, the digital control circuit 110 and the CDR circuit 120 may be formed on a single substrate 190. Forming the digital control circuit 110 and the CDR circuit 120 on the single substrate 190 may include forming physical transistor level components of the digital control circuit 110 and the CDR circuit 120 on the single substrate 190. In some embodiments, the CDR circuit 120 may include multiple analog components formed on the single substrate 190. Some of the multiple analog components within the CDR circuit 120 may be formed using bi-polar junction transistors (BJTs). Additionally, the digital control circuit 110 may be formed using complementary metal-oxide semiconductor (CMOS) transistors arranged to produce some form of a processor, such as a microprocessor, that operates based on firmware, software, or some other type of processor instructions stored on a computer readable medium. In some embodiments, the CDR circuit 120 may be configured to operate in an analog domain and the digital control circuit 110 may be configured to operate in a digital domain. With the digital control circuit 110 arranged to operate based on firmware, software, or some other type of processor instructions, the operation of the system 100 may be changed, altered, varied, or otherwise adapted more readily for different operating environments, constraints, and other changes that may affect the system 100.

Figure 2:
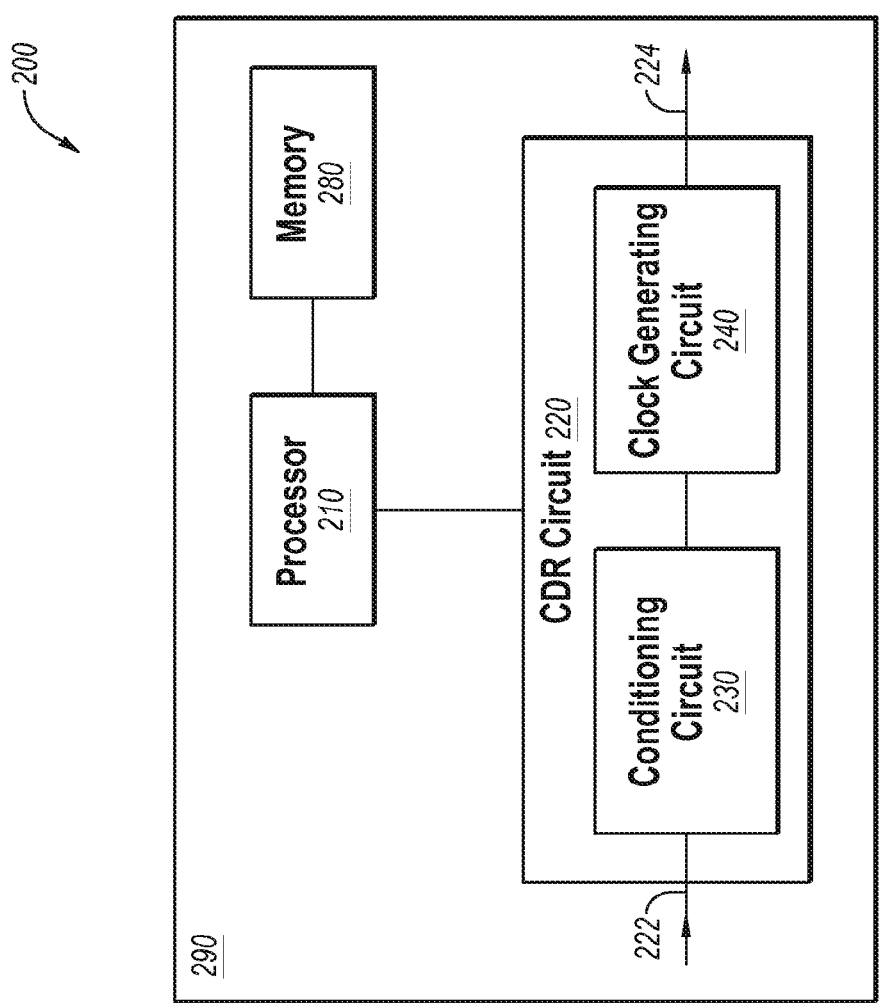
FIG. 2 is a block diagram of another example system with a clock and data recovery circuit.

FIG. 2 is a block diagram of an example system 200 with a CDR circuit 220, arranged in accordance with at least some embodiments described herein. The system 200 may include the CDR circuit 220, a processor 210, and a memory 280. The CDR circuit 220 may be coupled to the processor 210. The processor 210 may be coupled to the memory 280. The CDR circuit 220 may include a conditioning circuit 230 and a clock generating circuit 240. The CDR circuit 220, the processor 210, and the memory 280 may be formed on a single substrate 290. The processor 210 and the CDR circuit 220 of FIG. 2 may respectively correspond to the digital control circuit 110 and the CDR circuit 120 of FIG. 1.

The conditioning circuit 230 of the CDR circuit 220 may be configured to receive a data signal on a data input lead 222 from an outside source and to condition the data signal. To condition the data signal, the conditioning circuit 230 may increase the signal integrity of the data signal. In some embodiments, the conditioning circuit 230 may increase the signal integrity of certain frequency components of the data signal. For example, the conditioning circuit 230 may increase the strength of higher frequencies components within the data signal to thereby increase an amount of time when the data signal may be sampled with fidelity. The conditioning circuit 230 may send the conditioned data signal to the clock generating circuit 240. The conditioning circuit 230 may further be configured to send data to the processor 210 and to be controlled and/or adaptively controlled by the processor 210.

The clock generating circuit 240 may be configured to generate and output a clock signal on a clock output lead 224 based on a data signal on the data input lead 222. The clock signal may be synchronized with the data signal and may be used for clocking the data signal and/or otherwise coordinating the receipt and analysis of the data signal at components outside the system 200. To generate the clock signal, the clock generating circuit 240 may determine a data rate of the data signal and tune a frequency and/or phase of the clock signal to match the data rate and phase of the data signal. The clock generating circuit 240 may further be configured to send data about the clock generating circuit 240 to the processor 210 and to be controlled and/or adaptively controlled by the processor 210.

The processor 210 may be configured to store data received from the CDR circuit 220 within the memory 280. For example, in some embodiments, the processor 210 may store one or more of: a voltage level of the CDR circuit 220, power consumption of the CDR circuit 220, a data rate of the data signal on the data input lead 222, a temperature of the CDR circuit 220, transmit and receive power levels of the CDR circuit 220, among potentially other data within the memory 280.

The processor 210 may also be configured to retrieve data stored in the memory 280. For example, the processor 210 may store a data rate of the data signal received by the CDR circuit 220 on the data input lead 222 and may later retrieve the data rate. The data stored in the memory 280 by the processor 210 may be used for diagnostics of the CDR circuit 220, controlling and/or adaptively controlling the CDR circuit 220, or for other purposes.

As illustrated in FIG. 2, the processor 210, the CDR circuit 220, and the memory 280 may be formed on the single substrate 290. Forming the processor 210, the CDR circuit 220, and the memory 280 may include forming physical transistor level components of the processor 210, the CDR circuit 220, and the memory 280 on the single substrate 290. In some embodiments, the CDR circuit 220 may include multiple analog components formed on the single substrate 290. Some of the multiple analog components within the CDR circuit 220 may be formed using BJTs. Additionally or alternatively, the processor 210 and/or the memory 280 may be formed using CMOS transistors. The processor 210 may be a microprocessor or some other type of processor and may operate based on firmware, software, or some other type of processor instructions stored on a computer-readable medium. In some embodiments, the computer readable medium may include the memory 280.

Figure 3:
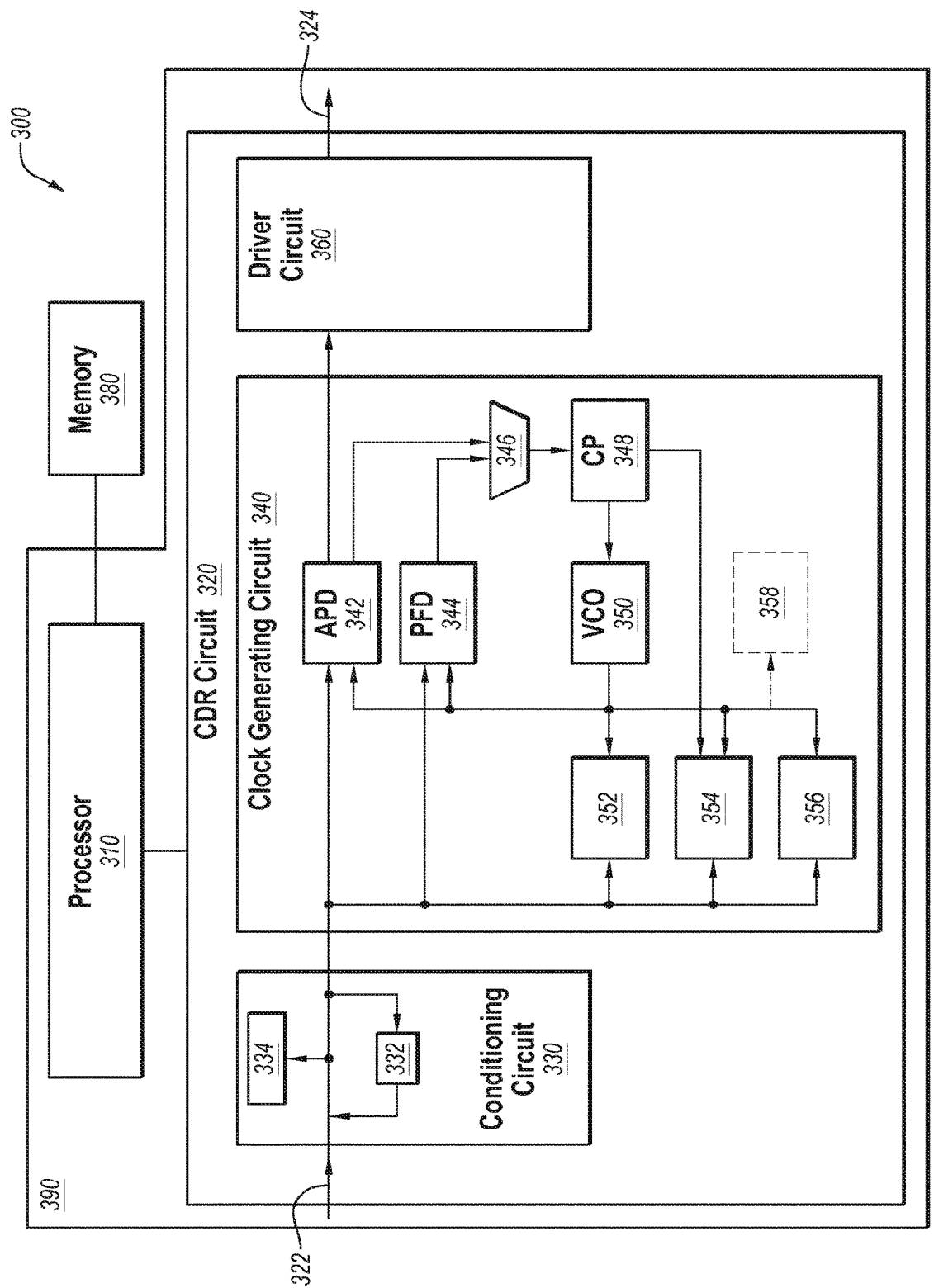
FIG. 3 is a block diagram of another example system with a clock and data recovery circuit.

FIG. 3 is a block diagram of an example system 300 with a CDR circuit 320, arranged in accordance with at least some embodiments described herein. The system 300 may include the CDR circuit 320, a processor 310, and a memory 380. The CDR circuit 320 may be coupled to the processor 310. The processor 310 may be coupled to the memory 380. The CDR circuit 320 may include a conditioning circuit 330, a clock generating circuit 340, and a driver circuit 360. The CDR circuit 320 and the processor 310 may be formed on a single substrate 390. The processor 310 and the CDR circuit 320 of FIG. 3 may respectively correspond to the digital control circuit 110 and the CDR circuit 120 of FIG. 1.

The conditioning circuit 330 may include an equalizer 332 and a signal detector 334. The clock generating circuit may include an alexander phase detector (APD) 342, a phase frequency detector (PFD) 344, a multiplexer 346, a charge pump (CP) 348, a voltage controlled oscillator (VCO) 350, an eye monitor (352), a window detector 354, and a bit error rate (BER) detector 356.

The conditioning circuit 330 may be coupled to a data input lead 322 configured to receive a data signal. The signal detector 334 within the conditioning circuit 330 may be configured to detect when a data signal is being received on the data input lead 322. In some embodiments, the signal detector 334 may detect a voltage level above a threshold to determine when a data signal is being received on the data input lead 322. Alternately or additionally, the signal detector 334 may detect when a data signal is being received on the data input lead 322 in a different manner. The signal detector 334 may send a signal to the processor 310 to indicate when a data signal is received. By receiving information about when a data signal is or is not being received on the data input lead 322, the processor 310 may enable or disable one or more components of the CDR circuit 220 to reduce power consumption or for other reasons. For example, the processor 310 may disable the APD 342, PFD 344, CP 348, and VCO 350 when no data signal is being received to reduce the power consumption of the CDR circuit 220. Alternately or additionally, the processor 310 may use the data from the signal detector 334 to cause one or more components of the system 300 to sleep or wake up.

The equalizer 332 within the conditioning circuit 330 may be configured to condition a data signal received on the data input lead 322. In particular, the equalizer 332 may be configured within a feedback loop and may be configured to increase the signal integrity of the data signal. In some embodiments, the equalizer 332 may increase the signal integrity of certain frequency components of the data signal. For example, the equalizer 332 may increase the strength of higher frequencies components within the data signal to thereby increase an amount of time when the data signal may be sampled with fidelity.

In some embodiments, the equalizer 332 may be configured to be controlled by the processor 310. The processor 310 may adjust settings within the equalizer 332 to determine how much to increase the strength of the higher frequencies components of the data signal. The processor 310 may adjust the settings within the equalizer 332 based on data received from the CDR circuit 220. In particular, the processor 310 may adjust the settings within the equalizer based on data received from the eye monitor 352, for example.

The eye monitor 352 may be configured to analyze a data signal received on the data input lead 322 using a signal generated by the VCO 350 similar to a clock signal output by the CDR circuit 220. The eye monitor 352 may determine one or more aspects of signal integrity of the data signal, such as, but not limited to, an amount of time when the data signal may be sampled with fidelity, an amount of data signal variation, sensitivity of the data signal to timing errors, an amount of jitter in the data signal, among potentially others. The eye monitor 352 may send data representing the signal integrity of the data signal to the processor 310. In some embodiments, the eye monitor 352 may determine the aspects of the signal integrity of a data signal continuously, intermittently, at start-up, or at some other predetermined time or times.

The processor 310 may adjust the settings of the equalizer 332 based on the signal integrity data received from the eye monitor 352. For example, the processor 310 may direct the equalizer 332 to increase a strength of the higher frequencies components of a data signal when the amount of time when the data signal may be sampled with fidelity is below a threshold level. As another example, the processor 310 may direct the equalizer 332 to decrease the strength of the higher frequencies components of a data signal when the amount of time when the data signal may be sampled with fidelity is above a threshold level so that the amount of time when the data signal may be sampled with fidelity is closer to the threshold level. By decreasing the strength of the higher frequencies components of the data signal while maintaining the amount of time when the data signal may be sampled with fidelity above the threshold level, the power consumption of the equalizer 332 may be reduced while maintaining the functionality of the CDR circuit 320. Furthermore, in some embodiments, decreasing the strength of the higher frequencies components of a data signal may reduce a jitter of the data signal. The processor 310 may thus optimize the settings of the equalizer 332 to obtain a setting for the equalizer 332 that is optimal for one or more of: a data signal based on the timing for sampling of the data signal, a jitter of the data signal, power consumption requirements of the CDR circuit 320, among potentially others.

The clock generating circuit 340 may receive a conditioned or non-conditioned data signal from the conditioning circuit 330. The clock generating circuit 340 may be configured to generate and output a clock signal to the driver circuit 360 based on the data signal from the conditioning circuit 330. To generate the clock signal, the clock generating circuit 340 may lock to a data rate of the data signal.

To lock to the data rate of a data signal, the VCO 350 may first generate a clock signal with a predetermined frequency. The predetermined frequency of the clock signal may be set in the VCO 350 by the processor 310. In some embodiments, the predetermined frequency of the clock signal may be based on the data rate of a previously received data signal. The data rate of the previously received data signal may be stored in the memory 380 and accessed by the processor 310. For example, the CDR circuit 320 may achieve a lock on a first data signal and generate a clock signal at a first frequency. The processor 310 may receive an indication of the first frequency from the CDR circuit 320 and store the first frequency in the memory 380. After losing a lock on the first data signal, the CDR circuit 320 may receive a second data signal. The processor 310 may set the frequency of the VCO 350 at the first frequency as the CDR circuit 320 attempts to obtain a lock on the second data signal. Alternately or additionally, the predetermined frequency of the VCO 350 may be based on a signal received by the processor 310 from an outside source, such as a circuit or user interface.

When locking to the data rate of the data signal, the processor 310 enables the PFD 344. The PFD 344, when enabled, compares the frequency of the clock signal from the VCO 350 with the data rate of the data signal. The PFD 344 may output a signal, related to the comparison of the frequency of the clock signal with the data rate of the data signal, to the multiplexer 346. The multiplexer 346 may select the output of the PFD 344 for passing to the CP 348 based on a signal from the processor 310.

The CP 348 receives the signal from the PFD 344 and may adjust a gain of an output voltage generated by the CP 348 based on the comparison of the frequency of the clock signal with the data rate of the data signal. The output voltage of the CP 348 is sent to the VCO 350 and may cause the VCO 350 to adjust the frequency and/or phase of the clock signal output by the VCO 350.

A difference between the frequency of the clock signal and the data rate of the data signal may be determined by the processor 310 based on data from the eye monitor 352, the window detector 354, and/or the BER detector 356. The eye monitor 352 may provide data to the processor 310 as previously discussed. The window detector 354 may provide data to the processor 310, such as rail voltages of the CP 348 and the gain of the CP 348. In some embodiments, the window detector 354 may determine the rail voltages of the CP 348 and the gain of the CP 348 continuously, intermittently, at start-up, or at some other predetermined time or times. The BER detector 356 may provide data to the processor 310 that indicates the bit error rate (BER) of the data signal based on the clock signal. In some embodiments, the BER detector 356 may determine the BER continuously, intermittently, at start-up, or at some other predetermined time or times.

Depending on the difference between the frequency of the clock signal and the data rate of the data signal, as determined by the eye monitor 352, the window detector 354, and/or the BER detector 356, the processor 310 may adjust the frequency of the VCO 350. The amount that the processor 310 may adjust the frequency of the VCO 350 may depend on the difference between the frequency of the clock signal and the data rate of the data signal, data rates of previously received data signals, a predetermined algorithm stored in the memory 380 and accessed by the processor 310, or some other data or algorithm. In some embodiments, the processor 310 may adjust the frequency of the VCO 350 by lowering or raising the frequency of the VCO 350. Alternately or additionally, the processor 310 may adjust the frequency by varying amounts. For example, the processor 310 may adjust the frequency by a 50 MHz step, 100 MHz step, 200 MHZ step, or some other amount. Alternately or additionally, the amount that the frequency is varied may differ. For example, the processor 310 may adjust the frequency by a 50 MHz step and then by a 100 MHz step.

Depending on the difference between the frequency of the clock signal and the data rate of the data signal, the processor 310 may also adjust the window or voltage rails of the CP 348 to adjust the voltage output of the CP 348. The amount that the processor 310 may adjust the window of the CP 348 may depend on the difference between the frequency of the clock signal and the data rate of the data signal, data rates of previously received data signals, a predetermined algorithm stored in the memory 380 and accessed by the processor 310, or some other data or algorithm. For example, if a faster locking time is desired, the processor 310 may extend the window of the CP 348. As another example, depending on the frequency selected for the VCO 350, the processor 310 may adjust the window of the CP 348.

The processor 310 may also adjust the window of the CP 348 to optimize the operation of the clock generating circuit 340. For example, in some embodiments, the processor 310 may set a first window for the CP 348 while the CDR circuit 320 locks to a data signal. After locking to the data signal, the processor 310 may set a second window for the CP 348 that is wider than the first window. By setting a narrower first window during the locking stage, the gain of the CP 348 is closer to the middle of the second window once the CDR circuit 320 is locked to the data signal. Accordingly, the CP 348 is able to produce a voltage swing that tracks a larger variation in the data rate of the data signal thereby reducing the likelihood of the CDR circuit 320 losing lock on the data signal due to variations in the data signal.

As another example, in some embodiments, the processor 310 may set a first gain for the CP 348 while the CDR circuit 320 locks to a data signal. After locking to the data signal, the processor 310 may set a second gain for the CP 348 that is smaller than the first gain. By adjusting the gain of the CP 348, the processor 310 may limit power consumption of the system 300.

The processor 310 may determine when the clock generating circuit 340 obtains a lock on the data signal based on data received from the clock generating circuit 340. In particular, the processor 310 may determine when the clock generating circuit 340 obtains a lock on the data signal based on data received from the BER detector 356. When the BER detector 356 indicates that the bit error rate of the data signal is below a predetermined bit error rate (BER) threshold, the processor 310 may determine that the clock generating circuit 340 has obtained a lock on the data signal. The predetermined BER threshold may vary based on the data rate of the data signal, an input from a source outside the system 300, an algorithm stored in the memory 380, other data stored in the memory 380, or some other data, signal, or indication received by the processor 310.

After the clock generating circuit 340 obtains a lock on the data signal, the processor 310 may disable the PFD 344 and enable the APD 342. The APD 342 may output a signal related to the comparison of the frequency of the clock signal with the data rate of the data signal to the multiplexer 346. The multiplexer 346 may select the output of the APD 342 for passing to the CP 348 based on a signal from the processor 310. In some embodiments, using the PFD 344 to obtain lock and changing to the APD 342 after obtaining lock to maintain the lock on the data signal may allow for faster locking of the data signal and decreased power consumption of the CDR circuit 320.

After locking to the data signal, the clock generating circuit 340, and in particular, the APD 342, may send the generated clock signal locked to the data signal to the driver circuit 360. The driver circuit 360 may amplify the clock signal and drive the clock signal onto a clock output lead 324.

The processor 310 may also be configured to store data received from the CDR circuit 320 within the memory 380. For example, in some embodiments, the processor 310 may store one or more of: a voltage level of the CDR circuit 320, power consumption of the CDR circuit 320, a data rate of the data signal on the data input lead 322, a temperature of the CDR circuit 320, transmit and receive power levels of the CDR circuit 320, among potentially other data.

Alternately or additionally, the clock generating circuit 340 may optionally include a bit sequence generator 358, that may be controlled by the processor 310 and used to generate bits sequences that may be used to verify the correct operation of the CDR circuit 320 or for some other use.

As illustrated in FIG. 3, the processor 310 and the CDR circuit 320 may be formed on the single substrate 390. Forming the processor 310 and the CDR circuit 320 may include forming physical transistor level components of the processor 310 and the CDR circuit 320 on the single substrate 390. Some of the multiple analog components within the CDR circuit 320, such as the CP 348, the VCO 350, among potentially others, may be formed using BJTs. Additionally or alternatively, the processor 310 may be formed using CMOS transistors. The processor 310 may be a microprocessor and may be configured to operate based on firmware, software, or some other type of processor instructions stored on a computer readable medium. In some embodiments, the computer-readable medium, may include the memory 380. The memory 380 may be any form of non-volatile memory, such as but not limited to, an EEPROM, EPROM, nor or nand flash, F-RAM, and MRAM.

By having the processor 310 and the CDR circuits 320 formed on a single substrate 390, communications between the processor 310 and the CDR circuits 320 may occur more rapidly than would be possible if the processor 310 was a separate chip from the CDR circuits 320. With the communications between the processor 310 and the CDR circuits 320 occurring more rapidly, the processor 310 may be able to receive and store information that otherwise might not be received and stored. For example, the processor 310 may receive a voltage indication from the CDR circuits 320 that is abnormal and may be able to store the voltage in the memory 380 before the abnormal voltage breaks down the system 300. The faster communications may thus lead to better detection of faults in the system 300 and in other systems coupled to the system 300.

Figure 4:
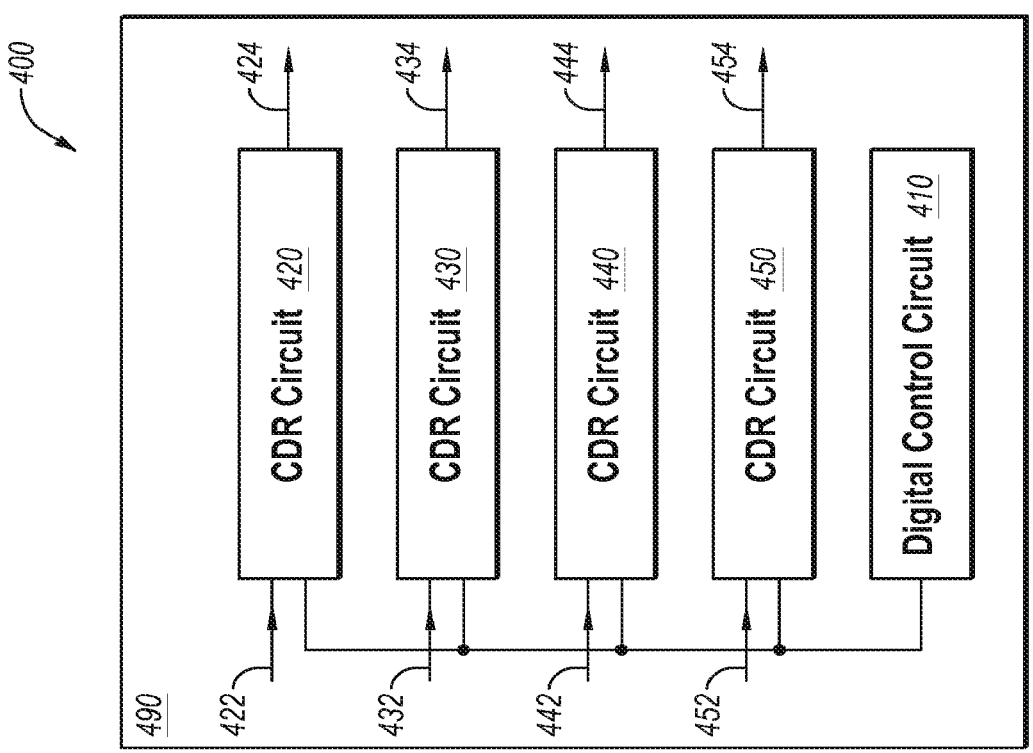
FIG. 4 is a block diagram of an example system with multiple clock and data recovery circuits, all arranged in accordance with at least some embodiments described herein.

FIG. 4 is a block diagram of an example system 400 with multiple CDR circuits 420, 430, 440, 450, arranged in accordance with at least some embodiments described herein. Each of the CDR circuits 420, 430, 440, 450 may include a respective data input lead 422, 432, 442, 452 and may each be configured to generate and output a clock signal on a respective clock output lead 424, 434, 444, 454. The clock signals generated by each CDR circuit 420, 430, 440, 450, may be based on and synchronized with respective data signals received by each CDR circuit 420, 430, 440, 450 on their respective data input lead 422, 432, 442, 452.

The data signals received by each CDR circuit 420, 430, 440, 450 may be generated from the same source, different sources, or some combination of shared sources. The data signals may be the same, a subset of the data signals may be the same, or the data signals may be different.

Each of the CDR circuits 420, 430, 440, 450 may be coupled to a digital control circuit 410. The digital control circuit 410 may be configured to receive data from each of the CDR circuits 420, 430, 440, 450. The digital control circuit 410 may also be configured to control and/or adaptively control each of the CDR circuits 420, 430, 440, 450. In some embodiments, the digital control circuit 410 may control and/or adaptively control each of the CDR circuits 420, 430, 440, 450 in a similar manner. Alternately or additionally, the digital control circuit 410 may control and/or adaptively control one or more subsets of the CDR circuits 420, 430, 440, 450 in a similar manner. Alternately or additionally, the digital control circuit 410 may control and/or adaptively control each of the CDR circuits 420, 430, 440, 450 independently, in a manner unique to the respective CDR circuit 420, 430, 440, 450.

Each of the CDR circuits 420, 430, 440, 450 may include a conditioning circuit, a clock generating circuit, and a driver circuit similar to the conditioning circuit 330, the clock generating circuit 340, and the driver circuit 360, respectively, illustrated in FIG. 3. In some embodiments, the digital control circuit 410 may be configured to control and/or adaptively control each of the conditioning circuits, the clock generating circuits, and the driver circuits within each of the CDR circuits 420, 430, 440, 450 independently, in a manner unique to the respective CDR circuit 420, 430, 440, 450 and respective conditioning circuit, clock generating circuit, and driver circuit.

The digital control circuit 410 may also be configured to control and/or adaptively control all of or a subset of the conditioning circuits of each of the CDR circuits 420, 430, 440, 450 as a group in a similar manner or a different manner. Likewise, the digital control circuit 410 may also be configured to control and/or adaptively control all of or a subset of the clock generating circuits of each of the CDR circuits 420, 430, 440, 450 as a group in a similar manner or a different manner and to control and/or adaptively control all of or a subset of the driver circuits of each of the CDR circuits 420, 430, 440, 450 as a group in a similar manner or a different manner. For example, based on a temperature reading of the single substrate 490, the digital control circuit 410 may control the driver circuits of each of the CDR circuits 420, 430, 440, 450 in a similar manner to compensate for the change in temperature of the single substrate 490.

In some embodiments, the digital control circuit 410 may be configured to control and/or adaptively control each of the CDR circuits 420, 430, 440, 450 separately in a manner similar to how, in FIG. 3, the processor 310 controls and/or adaptively controls the CDR circuit 320.

As illustrated in FIG. 4, the digital control circuit 410 and the CDR circuits 420, 430, 440, 450 may be formed on a single substrate 490. Forming the digital control circuit 410 and the CDR circuits 420, 430, 440, 450 on the single substrate 490 may include forming physical transistor level components of the digital control circuit 410 and the CDR circuits 420, 430, 440, 450 on the single substrate 490. In some embodiments, the CDR circuits 420, 430, 440, 450 may each include multiple analog components formed on the single substrate 490. Some of the multiple analog components within each of the CDR circuits 420, 430, 440, 450 may be formed using BJTs. Additionally or alternatively, the digital control circuit 410 may be formed using CMOS transistors arranged to produce some form of a processor, such as a microprocessor, that operates based on firmware, software, or some other type of processor instructions stored on a computer readable medium.

Although FIG. 4 illustrates, four CDR circuits 420, 430, 440, 450 formed on the single substrate 490 with the digital control circuit 410, more or less CDR circuits may be formed on the single substrate 490 with the digital control circuit 410 without departing from the scope of this disclosure. For example, two, three, five, six, eight, twelve, or sixteen, CDR circuits may be formed on the single substrate 490 with the digital control circuit 410.

The embodiments described herein may include the use of a special purpose or general-purpose computer including various computer hardware or software modules, as discussed in greater detail below.

Embodiments described herein may be implemented using computer-readable media for carrying or having computer-executable instructions or data structures stored thereon. Such computer-readable media may be any available media that may be accessed by a general purpose or special purpose computer. By way of example, and not limitation, such computer-readable media may comprise tangible computer-readable media including RAM, ROM, EEPROM, CD-ROM or other optical disk storage, magnetic disk storage or other magnetic storage devices, or any other medium which may be used to carry or store desired program code means in the form of computer-executable instructions or data structures and which may be accessed by a general purpose or special purpose computer. Combinations of the above should also be included within the scope of computer-readable media.

Computer-executable instructions comprise, for example, instructions and data that cause a general-purpose computer, special purpose computer, or special-purpose processing device to perform a certain function or group of functions. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

As used herein, the term "module" or "component" may refer to software objects or routines that execute on the computing system. The different components, modules, engines, and services described herein may be implemented as objects or processes that execute on the computing system (e.g., as separate threads). While the system and methods described herein are preferably implemented in software, implementations in hardware or a combination of software and hardware are also possible and contemplated. In this description, a "computing entity" may be any computing system as previously defined herein, or any module or combination of modulates running on a computing system.

All examples and conditional language recited herein are intended for pedagogical objects to aid the reader in understanding the invention and the concepts contributed by the inventor to furthering the art, and are to be construed as being without limitation to such specifically recited examples and conditions. Although embodiments of the present inventions have been described in detail, it should be understood that the various changes, substitutions, and alterations could be made hereto without departing from the spirit and scope of the invention.

What is claimed is:

1. A system, comprising:
 a clock and data recovery circuit that includes a voltage controlled oscillator (VCO) and a charge pump coupled to the VCO; and
 processing circuitry configured to control the clock and data recovery circuit based on previously stored data that includes a data rate of a previously received data signal from the clock and data recovery circuit, the processing circuitry controlling the clock and data recovery circuit by directing the clock and data recovery circuit to begin at the data rate of the previously received data signal when locking to a data signal;
 wherein the clock and data recovery circuit includes a charge pump, wherein the processing circuitry is configured to set rail voltages of the charge pump at a first set of voltages when the clock and data recovery circuit locks to the data signal and to set the rail voltages of the charge pump at a second set of voltages after the clock and data recovery circuit locks to the data signal, wherein a first difference between voltages of the first set of voltages is smaller than a second difference between voltages of the second set of voltages.

2. The system of claim 1, wherein the clock and data recovery circuit is an analog circuit and the processing circuitry is a digital circuit, wherein transistors in the clock and data recovery circuit and the processing circuitry are formed on a single substrate.

3. The system of claim 1, wherein the processing circuitry directs the VCO to begin at the data rate of the previously received data signal when locking to the data signal.

4. The system of claim 1, wherein the processing circuitry is further configured to select the second set of voltages based on a gain of the charge pump after the clock and data recovery circuit locks to the data signal.

5. The system of claim 1, wherein a first center voltage between the voltages of the first set of voltages is approximately equal to a second center voltage between the voltages of the second set of voltages.

6. The system of claim 1, wherein the processing circuitry is configured to reduce a gain of the charge pump after the clock and data recovery circuit locks to the data signal.

7. A system, comprising:
a clock and data recovery circuit; and
processing circuitry configured to control the clock and data recovery circuit based on previously stored data that includes a data rate of a previously received data signal from the clock and data recovery circuit, the processing circuitry controlling the clock and data recovery circuit by directing the clock and data recovery circuit to begin at the data rate of the previously received data signal when locking to a data signal,
wherein the clock and data recovery circuit includes a charge pump, wherein the processing circuitry is configured to set rail voltages of the charge pump at a first set of voltages when the clock and data recovery circuit locks to the data signal and to set the rail voltages of the charge pump at a second set of voltages after the clock and data recovery circuit locks to the data signal, wherein a first difference between voltages of the first set of voltages is smaller than a second difference between voltages of the second set of voltages.

8. The system of claim 7, wherein the clock and data recovery circuit is an analog circuit and the processing circuitry is a digital circuit, wherein transistors in the clock and data recovery circuit and the processing circuitry are formed on a single substrate.

9. The system of claim 7, wherein the clock and data recovery circuit includes an oscillator, wherein the processing circuitry directs the oscillator to begin at the data rate of the previously received data signal when locking to the data signal.

10. The system of claim 7, wherein the processing circuitry is further configured to select the second set of voltages based on a gain of the charge pump after the clock and data recovery circuit locks to the data signal.

11. The system of claim 7, wherein a first center voltage between the voltages of the first set of voltages is approximately equal to a second center voltage between the voltages of the second set of voltages.

12. The system of claim 7, wherein the processing circuitry is configured to reduce a gain of the charge pump after the clock and data recovery circuit locks to the data signal.

13. A system, comprising:
a clock and data recovery circuit that includes a voltage-controlled oscillator (VCO) and a charge pump coupled to the VCO; and
processing circuitry configured to control the clock and data recovery circuit based on previously stored data received from the clock and data recovery circuit and that includes a data rate of a previously received data signal and a first frequency of the VCO at which the clock and data recovery circuit locked to the previously received data signal, the processing circuitry controlling the clock and data recovery circuit by directing the clock and data recovery circuit to begin at the data rate of the previously received data signal when locking to a data signal, including setting a frequency of the VCO to the first frequency to begin locking to the data signal;
wherein the clock and data recovery circuit is an analog circuit and the processing circuitry is a digital circuit, wherein transistors in the clock and data recovery circuit and the processing circuitry are formed on a single substrate.

14. The system of claim 13, wherein the clock and data recovery circuit includes a charge pump, wherein the processing circuitry is configured to set rail voltages of the charge pump at a first set of voltages when the clock and data recovery circuit locks to the data signal and to set the rail voltages of the charge pump at a second set of voltages after the clock and data recovery circuit locks to the data signal, wherein a first difference between voltages of the first set of voltages is smaller than a second difference between voltages of the second set of voltages.

15. The system of claim 14, wherein the processing circuitry is further configured to select the second set of voltages based on a gain of the charge pump after the clock and data recovery circuit locks to the data signal.

16. The system of claim 14, wherein a first center voltage between the voltages of the first set of voltages is approximately equal to a second center voltage between the voltages of the second set of voltages.

17. The system of claim 14, wherein the processing circuitry is configured to reduce a gain of the charge pump after the clock and data recovery circuit locks to the data signal.

18. The system of claim 1, wherein the clock and data recovery circuit further includes a conditioning circuit with an equalizer and a signal detector at an input of the clock and data recovery circuit.

19. The system of claim 1, wherein the processing circuitry is further configured to enable or disable one or more components of the clock and data recovery circuit during operation to reduce power consumption.

20. The system of claim 13, wherein the processing circuitry is further configured to enable or disable one or more components of the clock and data recovery circuit during operation to reduce power consumption.

* * * * *